CRYSTAL CONTROLLED OSCILLATOR CIRCUIT UTILIZING TRANSISTORS

Filed Oct. 21, 1965

INVENTOR
LEONARD ROY HARPER
By Otto Schmid, Jr.
ATTORNEY

United States Patent Office 3,350,662
Patented Oct. 31, 1967

3,350,662

CRYSTAL CONTROLLED OSCILLATOR CIRCUIT UTILIZING TRANSISTORS

Leonard Roy Harper, San Jose, Calif., assignor to International Business Machines Corporation, Armonk, N.Y., a corporation of New York Filed Oct. 21, 1965, Ser. No. 499,366
5 Claims. (Cl. 331—116)

This invention relates to pulse generators and, more particularly, to crystal controlled oscillator circuits utilizing transistors for producing output pulses.

Prior art transistor oscillators have suffered from a frequency drift problem which is caused by the variation of the transistor parameters with variations in the supply voltage and with temperature. The inter-element capacitance effects, associated with a transistor, vary with the applied voltage and with temperature. The capacity effects are due to the PN junction within the transistor and the width of the PN junction varies in accordance with the voltage across the junction and the current flow through the junction. These variations have a correspondingly greater effect on the circuit as the frequency of operation of the circuit is increased. It is therefore an object of the present invention to produce an improved oscillator circuit having a stable frequency output despite variations in ambient temperature and supply voltage.

It is another object of this invention to provide a crystal controlled oscillator circuit employing transistors which is capable of stable high frequency operation.

It is a further object of this invention to provide an oscillator circuit in which the oscillator frequency is controlled by a simple crystal control means and large output signals are obtained in a first stage of the circuit to overdrive a second stage of the circuit and thereby provide a series of substantially squarewave output pulses.

It is a still further object of this invention to provide an oscillator circuit in which the output pulses have steep edge portions so that the output pulses can be used for precise timing purposes.

Briefly, the pulse generator of this invention comprises a transistor oscillatory circuit the frequency of which is controlled by a frequency-determining means. The inter-element capacitances of the transistor are shunted by relatively large capacitors and the frequency-determining means is coupled in series with a relatively small capacitor between the collector and base electrode of the transistor. This combination forms a tank circuit which causes the frequency-determining means to oscillate in the parallel resonant mode. An output signal of relatively high amplitude is coupled from the junction between the small capacitor and the frequency-determining means to a transistor amplifier circuit. The high amplitude signal causes the amplifier circuit to be overdriven so that the output from the amplifier comprises a series of substantially squarewave output pulses.

The foregoing and other objects, features and advantages of the invention will be apparent from the following more particular description of a preferred embodiment of the invention as illustrated in the accompanying drawings.

Figure 1:
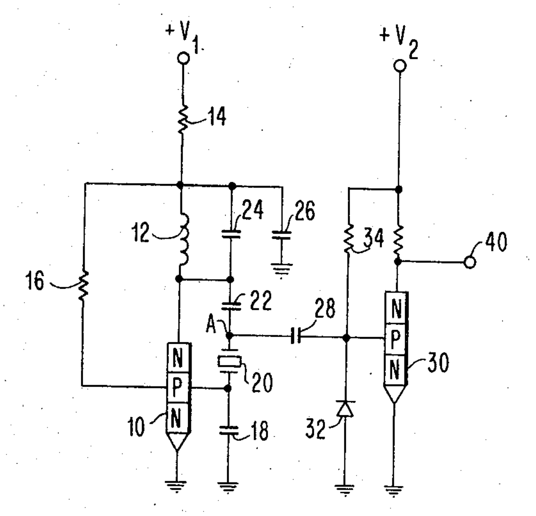
FIGURE 1 is a schematic diagram of a pulse generator embodying the present invention.

Referring to the drawings, transistor 10 and its associated circuitry form an oscillatory circuit and the frequency of the circuit is controlled by a frequency-determining means 20. The output from oscillatory circuit 10 is taken at the highest potential point A in the circuit and coupled to the input of amplifier circuit 30. The signal is of sufficient magnitude to overdrive amplifier 30 so that a series of squarewave pulses is provided to a utilization circuit at output terminal 40.

Transistor 10 is connected in a grounded emitter circuit and the collector of transistor 10 is coupled through a choke 12 and a resistor 14 to a suitable voltage supply $V_1$ which may be of the order of +6 volts. The frequency-determining means 20 may comprise any suitable device such as a piezoelectric crystal. A crystal 20 has one terminal connected to the base of transistor 10 and the other terminal is connected through a small value capacitor 22 to the collector of transistor 10. To minimize the inter-electrode capacitance effect of the transistor 10 due to variations in the supply voltage and variations with temperature, shunt capacitances 18 and 24 are provided. Shunt capacitances 18 and 24 are chosen much larger than the corresponding inter-element capacitance so that the effect of the inter-element capacitance will be masked out by the large shunt capacitances. While the large shunt capacitances perform the function of effectively masking out the effects of the inter-element capacitance from the circuit operation, they also provide a difficulty in the circuit since it is difficult to match the impedance that the crystal looks into; however, this problem is solved by providing relatively small capacitors 22 and 28 which the crystal looks into. By this means, the oscillator more properly matches the crystal feedback to the base impedance thereby making the impedance the crystal looks into almost wholly capacitive. The voltage is coupled from point A through capacitor 28 to the amplifier stage 30. The voltage at point A is much higher than the supply voltage and the value of voltage at point A is determined in large part by the collector capacity and its ratio to the capacity at point A. The large voltage swing at point A causes amplifier stage 30 to be overdriven so that the output at terminal 40 remains constant over a wide range of oscillator supply voltage and temperature variations.

When voltage is applied to the circuit, transistor 10 is turned on and the initial conduction shock excites the tank circuit comprising crystal 20 and the equivalent capacitance and this results in a sine wave being applied to the base of transistor 10. The values of resistors 14 and 16 are chosen to place transistor 10 at the proper operating point. The value of choke 12 is chosen to raise the A.C. impedance of the collector of transistor 10 to a high value so that the collector impedance does not shunt capacitor 24. Capacitor 24 is chosen as large as possible without too greatly loading the collector of transistor 10.

Capacitor 24 is effectively across the collector to emitter inter-element capacitance since capacitor 26 is a bypass capacitor and it presents substantially zero impedance to the radio-frequency signals. For this reason the upper end (FIGURE 1) of capacitor 24 may be returned to the reference potential without appreciably affecting the operation of the circuit. The presence of capacitors 18, 24 effectively removes the variation of the inter-element capacitances with oscillator supply voltage and collector current as a factor in varying the oscillator frequency.

Figure 2:
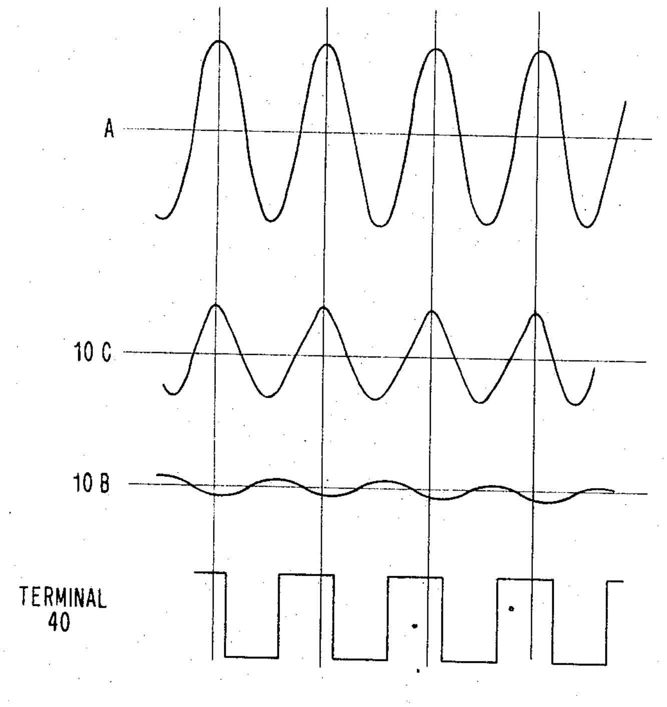
FIGURE 2 shows a series of voltage waveforms on a time base for indicated points in the circuit of FIGURE 1.

As shown in FIGURE 2, a sine wave is present at the base of the transistor 10 and a sine wave of increased amplitude is present at point A. The capacitors in the circuit are chosen so that the circuit properly matches the crystal feedback to the base impedance thereby making the impedance the crystal looks into almost wholly capacitive. The feedback path comprises capacitors 18, 22 and 24 and a crystal 20. Sufficient feedback is provided to maintain oscillation in the circuit and since the crystal is the frequency-determining element in the circuit, the crystal oscillates at its parallel resonant frequency. At frequencies above and below this frequency impedance of the crystal decreases and reduces the amount of feedback; and this, in turn, prevents oscillation at frequencies other than the parallel resonant frequency. The output from the oscillator circuit is taken from point A where the magnitude of voltage is determined by the collector capacity and its ratio to the capacity at the output point in the circuit. This voltage amplitude is typically several times the value of the D.C. supply voltage $V_1$.

The input voltage to the base of transistor 30 causes the transistor to be driven into saturation on the positive going part of the cycle. The negative going part of the input wave is clipped when the voltage at the base of transistor 30 is reduced to the point at which diode 32 is backbiased. This occurs when the voltage developed across resistor 34 balances the input voltage. The size of resistor 34 is normally chosen so that the output waveform which is taken from the collector of transistor 30 at terminal 40 is symmetrical tbout the zero axis; however, if a nonsymmetrical waveform is desired, resistor 34 can be changed to obtain a different waveform.

In one particular embodiment of the pulse generator of the type represented in FIGURE 1, the circuit values were employed as follows:

| | |
|---|---|
| Resistor **14** ________ohms__ | 470 |
| Resistor **16** ________do____ | 43,000 |
| Resistor **34** ________do____ | 2,200 |
| Choke **12** ________micro-henries__ | 56 |
| Capacitor **18** ________picofarads__ | 2,000 |
| Capacitor **22** ________do____ | 33 |
| Capacitor **24** ________do____ | 200 |
| Capacitor **26** ________micro-farads__ | 4.7 |
| Capacitor **28** ________picofarads__ | 33 |
| Diode **32** ________ | Type DK |
| Transistor **10** ________ | 2N744 |
| Transistor **30** ________ | 2N744 |
| $V_1$ ________volts__ | +6 |
| $V_2$ ________do____ | +3 |

The foregoing circuit was constructed to operate at a frequency of 4 megacycles. The circuit operated satisfactorily over a frequency range of 2 to 10 mc. by merely changing the crystal. With an oscillator supply voltage of six volts, the peak to peak voltage at point A was 35 to 70 volts depending on frequency and the Q of the crystal and the output was a squarewave of 2.7 volts peak to peak having a maximum rise time of 10 nanoseconds. It was discovered that the oscillator supply voltage could be reduced to about one volt without appreciably affecting the output voltage or frequency. In addition, the variation in output voltage from 10 degrees to 55 degrees centigrade caused a change in output frequency of 60 to 70 cycles and almost all of this total was found to be due to the change in frequency of the crystal itself.

Thus, it can be seen that the circuit provides an extremely stable output even in the presence of wide variations in both supply voltage and ambient temperature.

While the invention has been particularly shown and described with reference to a preferred embodiment thereof, it will be understood by those skilled in the art that various changes in the form and details may be made therein without departing from the spirit and scope of the invention.

What is claimed is:

1. A pulse generator comprising:

a transistor having emitter, collector and base electrodes;

means to supply operating potentials to said emitter and collector electrodes;

an electromechanical resonator element and a first impedance matching capacitor connected in series between said base and collector electrodes of said transistor with said capacitor being connected to the collector electrode and said electromechanical resonator element being connected to said base electrode;

means for coupling a relatively large second capacitor between said emitter and base electrodes of said transistor to compensate for the emitter-base inter-element capacitance;

means for coupling a relatively large third capacitor between said collector and emitter electrodes of said transistor to compensate for the collector-emitter inter-element capacitance; and means for coupling the junction between said first capacitor and said electromechanical resonator element through an impedance matching element to a utilization circuit.

2. A pulse generator as set forth in claim 1 in which said electromechanical resonator element comprises a piezoelectric crystal operating in its parallel resonant mode.

3. A pulse generator as set forth in claim 1 in which said impedance matching element comprises a relatively small capacitor.

4. A pulse generator as set forth in claim 1 in which said utilization circuit comprises an amplifier operating at saturation.

5. A pulse generator as set forth in claim 1 further comprising means for coupling a choke and a first resistor between the collector electrode and said operating potential:

means for coupling a fourth bypass capacitor from the junction of said choke and said first resistor to said emitter electrode; and means for coupling a second resistor from said junction between said choke and said first resistor to said base electrode.

References Cited

UNITED STATES PATENTS

| | | | |
|---|---|---|---|
| 3,037,171 | 5/1962 | Cerofolini ________ | 331—117 |
| 3,158,821 | 11/1964 | Sulzer ________ | 331—116 |
| 3,267,390 | 8/1966 | Dimmer ________ | 331—117 |

JOHN KOMINSKI, *Primary Examiner*.

ROY LAKE, *Examiner*.